United States Patent
Hlavaty et al.

(10) Patent No.: US 9,566,603 B2
(45) Date of Patent: Feb. 14, 2017

(54) SPLIT COATING MASK SYSTEM FOR GAS TURBINE ENGINE COMPONENT

(71) Applicant: United Technologies Corporation, Hartford, CT (US)

(72) Inventors: Kirk D. Hlavaty, East Hartford, CT (US); Bartolomeo Palmieri, Guilford, CT (US); Harvey R. Toppen, Glastonbury, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 14/188,089

(22) Filed: Feb. 24, 2014

(65) Prior Publication Data

US 2014/0242278 A1   Aug. 28, 2014

Related U.S. Application Data

(60) Provisional application No. 61/770,167, filed on Feb. 27, 2013.

(51) Int. Cl.

| | |
|---|---|
| *B05B 15/04* | (2006.01) |
| *B05D 1/32* | (2006.01) |
| *B05C 21/00* | (2006.01) |
| *C23C 14/04* | (2006.01) |
| *F01D 5/00* | (2006.01) |
| *F01D 25/28* | (2006.01) |
| *F01D 5/28* | (2006.01) |

(52) U.S. Cl.
CPC .......... *B05C 21/005* (2013.01); *B05B 15/045* (2013.01); *C23C 14/042* (2013.01); *F01D 5/005* (2013.01); *F01D 25/285* (2013.01); *F01D 5/288* (2013.01); *F05D 2230/90* (2013.01); *Y10T 29/49826* (2015.01)

(58) Field of Classification Search
None
See application file for complete search history.

(56) References Cited

U.S. PATENT DOCUMENTS

| | | | |
|---|---|---|---|
| 4,726,104 A | 2/1988 | Foster et al. | |
| 4,867,307 A * | 9/1989 | Bovee | A63C 11/027 206/315.1 |
| 6,177,038 B1 | 1/2001 | Reed et al. | |
| 6,224,361 B1 | 5/2001 | Reed et al. | |
| 6,474,348 B1 | 11/2002 | Beggs et al. | |
| 7,503,113 B2 | 3/2009 | Gosling et al. | |
| 7,536,783 B2 | 5/2009 | Davis et al. | |
| 7,730,756 B2 | 6/2010 | Gosling et al. | |
| 7,763,823 B2 | 7/2010 | Zajchowski et al. | |
| 8,105,133 B2 | 1/2012 | Jayabalan | |
| 8,334,473 B2 | 12/2012 | Zajchowski et al. | |
| 2006/0021579 A1* | 2/2006 | Bernaski | C23C 4/01 118/720 |
| 2009/0252872 A1* | 10/2009 | Saylor | C23C 10/04 427/248.1 |
| 2011/0200752 A1* | 8/2011 | Dorn | C23C 4/01 427/282 |
| 2011/0239934 A1* | 10/2011 | Soucy et al. | 118/505 |

* cited by examiner

*Primary Examiner* — Lisha Jiang
(74) *Attorney, Agent, or Firm* — O'Shea Getz P.C.

(57) ABSTRACT

A mask assembly for a gas turbine engine component includes a second mask that at least partially overlaps a first mask to fit a platform of a gas turbine engine component.

6 Claims, 3 Drawing Sheets

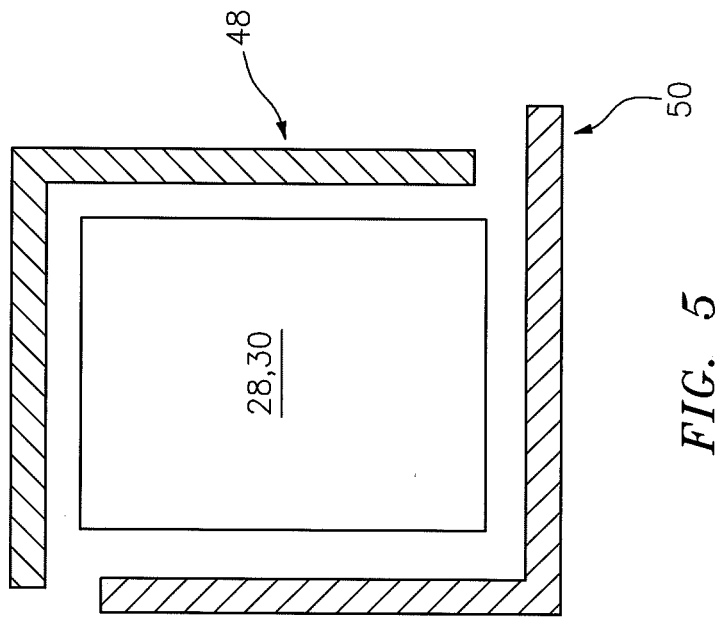
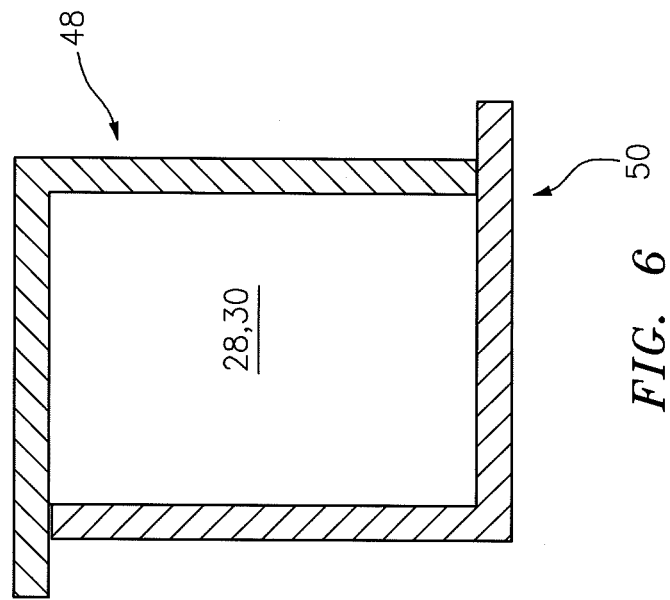

SPLIT COATING MASK SYSTEM FOR GAS TURBINE ENGINE COMPONENT

This application claims priority to U.S. Patent Appln. No. 61/770,167 filed Feb. 27, 2013.

BACKGROUND

The present disclosure relates to coating processes and equipment for gas turbine engine components, and more particularly, to a method and masking assembly for selectively depositing a coating on a selected portion of a gas turbine engine component.

Gas turbine engines, such as those that power modern commercial and military aircraft, generally include a compressor section to pressurize an airflow, a combustor section to burn hydrocarbon fuel in the presence of the pressurized air, and a turbine section to extract energy from the resultant combustion gases.

Gas turbine engine hot section components such as turbine blades and turbine vanes are subject to high thermal loads for prolonged time periods. Turbine section blades and vanes typically include an airfoil within hot combustion core gases from the upstream combustor section. Because of the high temperatures and corrosive effects of such hot combustion core gases a protective coating such as a thermal barrier coating provides insulation from the high temperatures and corrosive effects therefrom.

One method to coat only the flow path surfaces is to segregate the airfoil with a rectilinear mask that shields a generally rectilinear platform. An operator manually slides the generally rectilinear platform into the mask to surround the platform. The mask may form a gap with respect to a generally rectilinear platform due to component tolerances.

The mask is manufactured of a temperature resistant metallic alloy to survive the thermal barrier coating spray application. Oftentimes the gap may receive overspray from the thermal barrier coating spray application and may glue the mask to the component. Once the thermal barrier coating sets, the component is typically released by tapping the component from the mask. This tapping may undesirably chip the thermal barrier coating and thereby reduce protection of the component.

SUMMARY

A mask assembly for a gas turbine engine component according to one disclosed non-limiting embodiment of the present disclosure includes a first mask; and a second mask that at least partially overlaps the first mask to fit a platform of a gas turbine engine component.

A further embodiment of the present disclosure includes, wherein a skirt of the second mask at least partially overlaps a skirt of the first mask.

A further embodiment of the present disclosure includes, wherein the skirt of the second mask and the skirt of the first mask are generally L-shaped in cross section.

A further embodiment of the present disclosure includes, wherein the skirt of the second mask and the skirt of the first mask slidably abut with a platform of the platform.

A further embodiment of the present disclosure includes, wherein the skirt of the second mask and the skirt of the first mask slidably abut with an edge of the gas turbine engine component.

A further embodiment of the present disclosure includes, wherein the skirt of the second mask and the skirt of the first mask slidably abut with a edge of the gas turbine engine vane.

A further embodiment of the present disclosure includes a handle that extends from the skirt of the second mask and a handle that extends from the skirt of the first mask.

A further embodiment of the present disclosure includes a clip that retains the second mask to the first mask.

A further embodiment of the present disclosure includes, wherein the clip is received on the handle that extends from the skirt of the second mask and the handle that extends from the skirt of the first mask.

A further embodiment of the present disclosure includes a post that extends from the first mask, the post slidably received within a slot in the second mask.

A method of masking a component of a gas turbine engine according to another disclosed non-limiting embodiment of the present disclosure includes slidably abutting a first mask and a second mask to at least partially overlap and fit gas turbine engine component.

A further embodiment of the present disclosure includes fitting a post that extends from the first mask into a slot in the second mask.

A further embodiment of the present disclosure includes fitting a skirt of the first mask and a skirt of the second mask to a fit a platform of the gas turbine engine component.

A further embodiment of the present disclosure includes clipping the first mask to the second mask.

A further embodiment of the present disclosure includes spraying a coating onto the gas turbine engine component; and unclipping the first mask from the second mask to remove the first mask from the second mask without chipping the coating.

A further embodiment of the present disclosure includes fastening the first mask to the second mask.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows:

FIG. 5 is a cross-sectional view of a skirt of the mask assembly around a platform of the turbine component; and FIG. 6 is a cross-sectional view of a skirt of the mask assembly mounted to the platform of the turbine component.

DETAILED DESCRIPTION

Figure 1:
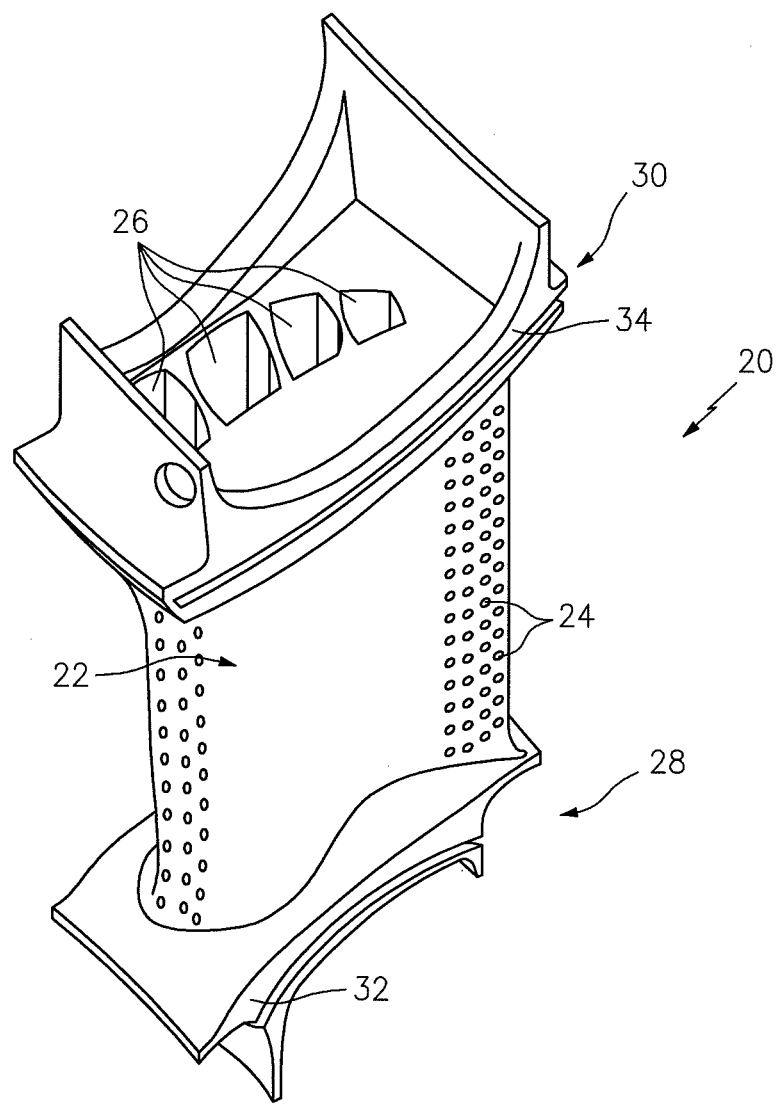
FIG. 1 is a perspective view of a turbine component.

FIG. 1 schematically illustrates a turbine component 20 that requires coating of only a portion thereof. The turbine component 20 is manufactured of a high temperature superalloy. The turbine component 20, for example a turbine vane, generally includes an airfoil 22 with a multiple of cooling holes 24 that communicate with internal passageways 26 that extend through at least one of an inner platform 28 and an outer platform 30. It should be appreciated that other turbine components such as vanes, blades and static structures will also benefit herefrom.

The flow path surfaces such as the airfoil 22 and the associated flow path surfaces of the platforms 28, 30 are coated to provide thermal barrier, environmental barriers and/or other capabilities required to facilitate survival in the high-temperature environment that may be in excess of 2400 degrees F. (1,315 degrees C.).

A rectilinear edge 32, 34 of the respective platforms 28, 30 need not be coated as the edges 32, 34 are not generally within the flow path and are precision machined interfaces to fit with corresponding shaped adjacent vanes or other components that together form the vane ring (not shown). Because of the precision machined surfaces of the rectilinear edge 32, 34, even small amounts of coating may adversely affect the tight tolerances in the assembly process. In addition, coating overspray may instigate chipping and thereby undesirably effect the fatigue life.

Figure 3:
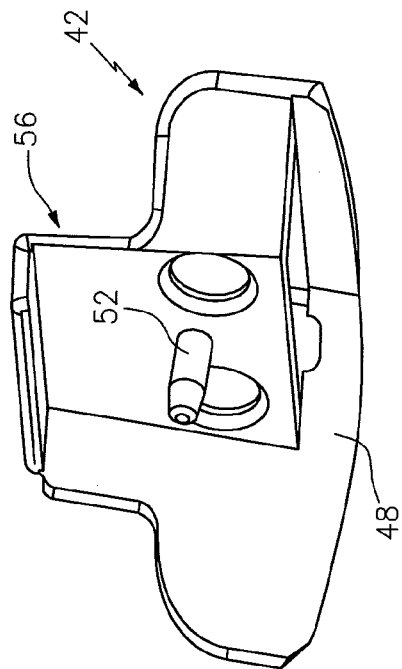
FIG. 3 is a perspective view of a first portion of the mask assembly.
Figure 4:
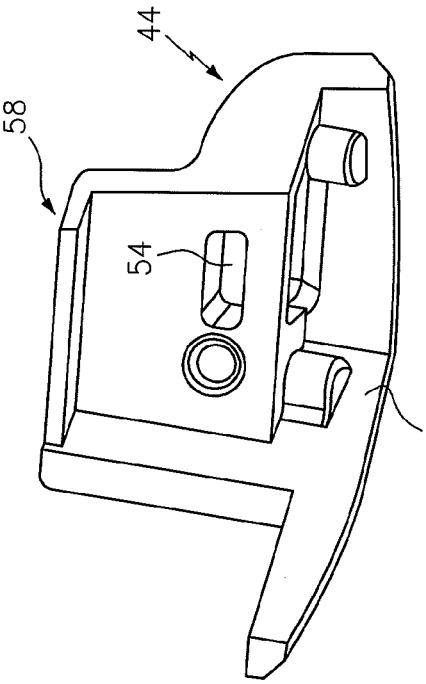
FIG. 4 is a perspective view of a second portion of the mask assembly.
Figure 2:
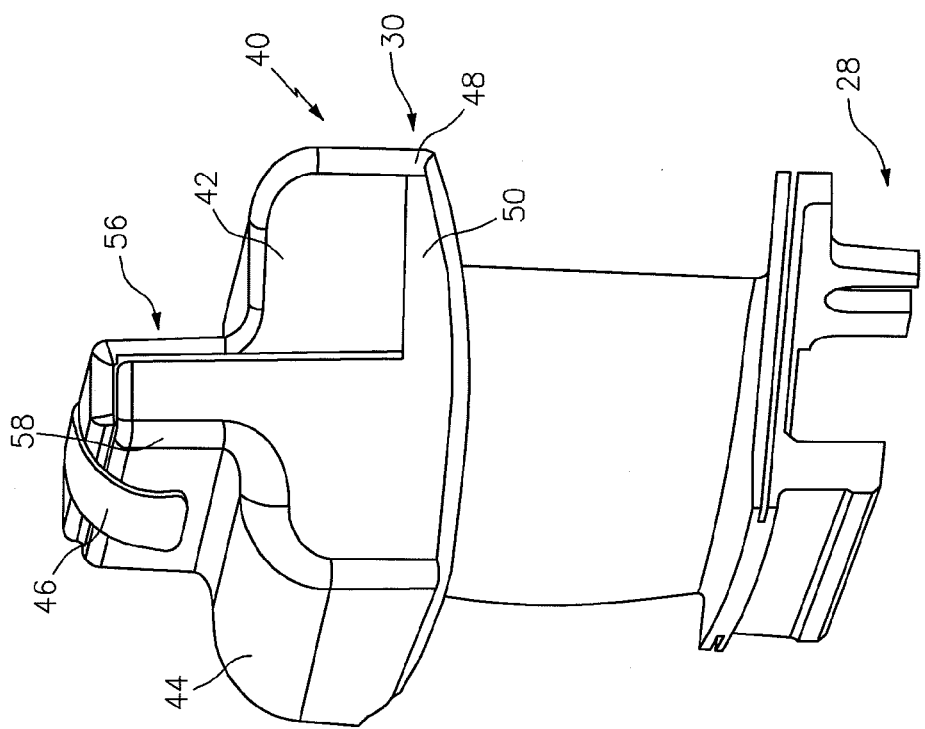
FIG. 2 is a perspective view of a turbine component inserted into a mask assembly.

With reference to FIG. 2, a mask assembly 40 (only one shown) shields the platforms 28, 30 from a spray coating operation. The mask assembly 40 includes a first mask 42 and a second mask 44 that fit together and are retained together by a fastener 46 such as clip or other retention member. The first mask 42 may be a concave mask (FIG. 3) and the second mask 44 (FIG. 4) may be a convex mask to closely surround the respective platforms 28, 30. The first mask 42 and the second mask 44 include skirt 48, 50 that are generally L-shaped in cross-section (FIG. 5) to accommodate tolerances in the respective platforms 28, 30. That is, the skirt 48, 50 of the first mask 42 and the second mask 44 at least partially overlap to closely fit a variety of platforms 28, 30 without a gap (FIG. 6). This overlap interface eliminates undesirable overspray on the edge 32, 34, that may cause a chipped coating when the overspray sticks to the mask. This thereby eliminates a post processing operation.

The first mask 42 includes a post 52 (FIG. 3) that is slidably received within a slot 54 (FIG. 3) in the second mask 44. That is, the slot 54 permits the skirt 48, 50 to slide relative to each other to provide the overlap interface and thereby closely abut the edges 32, 34 of a variety of platforms 28, 30. That is, the relative overlap between the skirt 48, 50 changes. Once closely positioned to abut the edges 32, 34, the fastener 46 is mounted around a handle 56, 58 of the respective first mask 42 and the second mask 44.

Disassembly is also facilitated as only the fastener 46 need be removed and the respective first mask 42 and the second mask 44 separated. This also minimizes or eliminates a potential cause of chipped coatings.

The use of the terms "a" and "an" and "the" and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward," "aft," "upper," "lower," "above," "below," and the like are with reference to the normal operational attitude of the vehicle and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A method of masking a component of a gas turbine engine comprising:
   slidably abutting a first mask and a second mask to at least partially overlap and fit a gas turbine engine component; and
   fitting a first skirt of the first mask and a second skirt of the second mask to fit a platform of the gas turbine engine component, wherein the first skirt and the second skirt partially overlap one another and are each L-shaped in a cross-section, the partial overlapping of the first and second skirts forming a mated mask around the gas turbine engine component, the mated mask exhibiting a T-shaped cross-section that is perpendicular to each of the L-shaped cross-sections of the first and second skirts.

2. The method as recited in claim 1, further comprising:
   fitting a post that extends from the first mask into a slot in the second mask.

3. The method as recited in claim 1, further comprising:
   clipping the first mask to the second mask.

4. The method as recited in claim 3, further comprising:
   spraying a coating onto the gas turbine engine component; and
   unclipping the first mask from the second mask to remove the first mask from the second mask without chipping the coating.

5. The method as recited in claim 1, further comprising:
   fastening the first mask to the second mask.

6. The method as recited in claim 5, wherein a fastener is mounted around a first handle of the first mask and a second handle of the second mask when fastening the first mask to the second mask.

* * * * *